(12) United States Patent
Rogalsky et al.

(10) Patent No.: US 8,605,253 B2
(45) Date of Patent: Dec. 10, 2013

(54) LITHOGRAPHIC PROJECTION OBJECTIVE

(75) Inventors: Olaf Rogalsky, Oberkochen (DE); Boris Bittner, Roth (DE); Thomas Petasch, Aalen (DE); Jochen Haeussler, Hermaringen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 1060 days.

(21) Appl. No.: 12/334,685

(22) Filed: Dec. 15, 2008

(65) Prior Publication Data

US 2009/0153829 A1 Jun. 18, 2009

Related U.S. Application Data

(63) Continuation of application No. PCT/EP2007/005837, filed on Jul. 2, 2007.

(60) Provisional application No. 60/818,396, filed on Jul. 3, 2006.

(51) Int. Cl.
*G03B 27/54* (2006.01)
*G03B 27/32* (2006.01)

(52) U.S. Cl.
USPC .............................................. 355/67; 355/77

(58) Field of Classification Search
USPC ............. 355/52, 53, 55, 67, 77; 359/819–820
See application file for complete search history.

(56) References Cited

U.S. PATENT DOCUMENTS

| | | | |
|---|---|---|---|
| 3,305,294 A | 2/1967 | Alvarez | |
| 5,392,119 A | 2/1995 | McArthur et al. | |
| 5,638,223 A | 6/1997 | Ikeda | |
| 5,677,757 A * | 10/1997 | Taniguchi et al. | .............. 355/71 |
| 5,757,017 A | 5/1998 | Braat | |
| 5,789,734 A | 8/1998 | Torigoe et al. | |
| 5,973,863 A | 10/1999 | Hatasawa et al. | |
| 6,104,472 A | 8/2000 | Suzuki | |
| 6,247,818 B1 | 6/2001 | Hedblom et al. | |
| 6,266,389 B1 | 7/2001 | Murayama et al. | |

(Continued)

FOREIGN PATENT DOCUMENTS

| | | |
|---|---|---|
| DE | 10 2005 030543 | 2/2006 |
| DE | 10 2005 015627 | 10/2006 |

(Continued)

OTHER PUBLICATIONS

Office Action in counterpart Taiwan patent application No. 96124003, with one page summary from Taiwanese associate, dated May 27, 2013.

*Primary Examiner* — Hung Henry Nguyen
(74) *Attorney, Agent, or Firm* — Fish & Richardson P.C.

(57) ABSTRACT

Projection objectives, related systems and components, and methods are disclosed. The methods include providing a projection objective of a lithography projection exposure apparatus, where the projection objective includes a plurality of optical elements between an object plane of the projection objective and an image plane of the projection objective, and the plurality of optical elements includes a first optical element having a refractive power and being disposed in the projection objective at a first location. The methods also include removing the first optical element from the projection objective, and inserting a first spare optical element into the projection objective at the first location, where the removing and inserting steps are performed at a location of use of the lithography projection exposure apparatus in a lithography process.

46 Claims, 7 Drawing Sheets

(56) References Cited

U.S. PATENT DOCUMENTS

| | | |
|---|---|---|
| 6,312,373 B1 | 11/2001 | Ichihara |
| 6,333,776 B1 | 12/2001 | Taniguchi et al. |
| 6,353,470 B1 | 3/2002 | Dinger |
| 6,366,410 B1 | 4/2002 | Schultz et al. |
| 6,522,390 B2 | 2/2003 | Suzuki et al. |
| 6,639,651 B2 | 10/2003 | Matsuyama |
| 6,639,696 B1 | 10/2003 | Nishio |
| 6,727,980 B2 | 4/2004 | Ota et al. |
| 6,995,930 B2 | 2/2006 | Shafer |
| 7,177,076 B2 | 2/2007 | Mann et al. |
| 7,253,880 B2 | 8/2007 | Loopstra et al. |
| 7,283,204 B2 | 10/2007 | Wegmann |
| 7,436,484 B2 | 10/2008 | Van Der Wijst et al. |
| 7,724,351 B2 * | 5/2010 | Loopstra et al. ............ 355/67 |
| 2001/0019403 A1 | 9/2001 | Schuster et al. |
| 2002/0008863 A1 | 1/2002 | Taniguchi et al. |
| 2002/0171922 A1 | 11/2002 | Shiraishi et al. |
| 2002/0183977 A1 | 12/2002 | Sui et al. |
| 2003/0081722 A1 | 5/2003 | Kandaka et al. |
| 2004/0042094 A1 | 3/2004 | Matsuyama |
| 2004/0112866 A1 | 6/2004 | Maleville et al. |
| 2005/0134972 A1 | 6/2005 | Kugler et al. |
| 2005/0225737 A1 | 10/2005 | Weissenrieder et al. |
| 2005/0286121 A1 | 12/2005 | Ulrich et al. |
| 2006/0028706 A1 | 2/2006 | Totzeck et al. |
| 2006/0055909 A1 | 3/2006 | Fiolka et al. |
| 2006/0109442 A1 | 5/2006 | Loopstra et al. |
| 2006/0139585 A1 | 6/2006 | Van Der Wijst et al. |
| 2006/0230413 A1 | 10/2006 | Rassel et al. |
| 2007/0014560 A1 | 1/2007 | Hylen et al. |
| 2008/0316444 A1 * | 12/2008 | Sorg et al. ............ 355/52 |
| 2009/0244509 A1 | 10/2009 | Limbach et al. |
| 2010/0014065 A1 | 1/2010 | Gruner et al. |
| 2010/0066990 A1 | 3/2010 | Bieg et al. |
| 2010/0149517 A1 | 6/2010 | Mann et al. |
| 2011/0228226 A1 | 9/2011 | Pixton |

FOREIGN PATENT DOCUMENTS

| | | |
|---|---|---|
| EP | 0 724 199 | 7/1996 |
| EP | 0 851 304 | 7/1998 |
| EP | 0 969 327 | 1/2000 |
| EP | 1 231 516 | 8/2002 |
| EP | 1 672 431 | 6/2006 |
| JP | 05-234 850 | 9/1993 |
| JP | 6-326000 | 11/1994 |
| JP | 8-241861 | 9/1996 |
| JP | 9-190969 | 7/1997 |
| JP | 10-054932 | 2/1998 |
| JP | 10-125590 | 5/1998 |
| JP | 10-142555 | 5/1998 |
| JP | 10-242048 | 9/1998 |
| JP | 2001-196305 | 7/2001 |
| JP | 2002-203767 A | 7/2002 |
| JP | 2002-324752 | 11/2002 |
| JP | 2004-506236 | 2/2004 |
| JP | 2005-513517 | 5/2005 |
| JP | 06 177008 | 6/2005 |
| JP | 2005-202375 | 7/2005 |
| JP | 2006-041540 | 2/2006 |
| JP | 2006-073584 | 3/2006 |
| JP | 2000-321027 | 11/2008 |
| JP | 2000-321028 | 11/2008 |
| JP | 2000-321029 | 11/2008 |
| JP | 2000-321031 | 11/2008 |
| JP | 2000-321039 | 11/2008 |
| KR | 10-2002-0067012 | 8/2002 |
| TW | 591694 | 6/2004 |
| WO | WO 02/12948 | 2/2002 |
| WO | WO 03/050609 | 6/2003 |
| WO | WO 03/075096 | 9/2003 |
| WO | WO 2004/019128 | 3/2004 |
| WO | WO 2004/086148 | 10/2004 |
| WO | WO 2005/031467 | 4/2005 |
| WO | WO 2005/050322 | 6/2005 |
| WO | WO 2005/064404 | 7/2005 |
| WO | WO 2005/069055 | 7/2005 |
| WO | WO 2006/014595 | 2/2006 |
| WO | WO 2006/053751 | 5/2006 |
| WO | WO 2006/121009 | 11/2006 |
| WO | WO 2006/126522 | 11/2006 |
| WO | WO 2007/000984 | 1/2007 |
| WO | WO 2007/022922 | 3/2007 |
| WO | WO 2007/085290 | 8/2007 |
| WO | WO 2008/003442 | 1/2008 |

* cited by examiner

LITHOGRAPHIC PROJECTION OBJECTIVE

CROSS-REFERENCE TO RELATED APPLICATIONS

This application is a continuation application of and claims priority to U.S. Application Ser. No. PCT/EP2007/005837, filed on Jul. 2, 2007, which claims priority to U.S. Provisional Application No. 60/818,396, Jul. 3, 2006. The contents of these applications are hereby incorporated by reference.

SUMMARY

The disclosure generally relates to projection objectives, such as projection objectives of lithography projection exposure apparatuses, as well as related systems, components and methods, such as methods of revising and/or repairing a projection objective.

BACKGROUND

A projection objective can be used in a lithography projection exposure apparatus to print a precision circuit pattern on a substrate (e.g., a wafer, a plate or the like) that is coated with a photosensitive material. The circuit pattern to be printed is typically provided by an object referred to as a reticle, which is imaged by the projection objective onto the substrate.

A projection objective of a lithography projection exposure apparatus generally includes optical elements between an object plane and an image plane. The term "between" is to be understood as meaning that the optical elements are arranged in a manner such that projection light coming from the object plane and arriving at the image plane reaches each optical element at least once. Terms like "before" and "after" are to be understood to refer to the order of the projection light propagating through the projection objective.

There are different types of projection objectives, generally referred to as dioptric, catoptric and catadioptric projection objectives. Generally, the optical elements in a dioptric projection objective are only refractive optical elements. Generally, the optical elements in a catoptric projection objective are only reflective optical elements. Generally, the optical elements in a catadioptric projection objective are refractive optical elements and reflective optical elements.

A projection objective is commonly referred to as an immersion projection objective if there is an immersion liquid between the last optical element of the projection objective and the image plane. Generally, in such an objective, the immersion liquid itself does not count as an optical element. A projection objective is commonly referred to as a double immersion projection objective if the projection objective has two immersion liquids and the last optical element of the projection objective is between the two immersion liquids. A double immersion projection objective is a type of immersion projection objective.

SUMMARY

In some embodiments, the disclosure provides methods of revising/repairing a projection objective of a lithography projection exposure apparatus. Embodiments of the methods can have one or more of the following features. In certain embodiments, the methods can be performed in the field (at the location of the customer). In some embodiments, the methods can be performed without removing/replacing all the optical elements in the projection objective. In certain embodiments, the methods can be performed with reduced use downtime at the customer. In some embodiments, the methods can be less time consuming to perform. In certain embodiments, the methods can be less expensive to perform. In some embodiments, the methods allow the image quality of the projection objective to be adapted according to the customer's needs.

In some embodiments, the projection objective includes a plurality of optical elements between an object plane and an image plane. The plurality of optical elements includes a first optical element having a refractive power. For purposes of the discussion herein, use of the term "first" or "second" when describing an optical element is to be understood as a label for the optical element and, unless otherwise specified, is not be understood as necessarily referring to a relative location of the optical element within the projection objective.

In certain embodiments, a method can include, without exchanging all of the optical elements: removing the first optical element from the projection objective at the customer; inserting a first spare optical element into the projection objective where the first optical element was located prior to its removal; and adjusting an image quality of the projection objective to a quality desired by the customer.

The disclosure is based, in part at least, on the concept that adverse effects of degraded optical components of a projection objective can be compensated by an exchange of one or more individual optical elements of the projection objective without exchanging all the optical elements of the projection objective. The methods disclosed herein can be less time consuming and can considerably reduce downtime of the projection objective at the customer. The methods can be carried out in the field (at the customer) without shipping the projection objective to the manufacturer of the projection objective. The methods can include an adjustment of the image quality of the projection objective to a quality which is desired by the customer. For example, it is possible to maintain the image quality of the original state of the projection objective. Optionally, however, it is possible to use the revision/repairing procedure to alter the image quality of the projection objective compared with the image quality of the original state of the projection objective.

The first spare optical element can be an optical element which is at least approximately adapted to the shape of the first optical element.

While the first spare optical element replaces the first optical element to compensate for degradation of one or more optical elements in the projection objective, it is unnecessary for the first optical element to have itself have undergone degradation.

In some embodiments, it can be advantageous to select the first optical element (and therefore the location of the first spare optical element) based on its position within the projection objective (e.g., close to a pupil plane, close to a field plane, and/or one or more planes therebetween), depending on the imaging settings used by the customer.

The imaging settings, depending on mask and illumination setting, might differ from customer to customer and lead to specific and different degradation effects. The first spare optical element might thus be different from optical system to optical system.

In some embodiments, the method can include working (e.g., machining) the first spare optical element prior to inserting it into the projection objective. For example, the first spare optical element can be worked so that it has at least one surface with an aspherical shape or a non-rotationally symmetric shape. Working the first spare optical element may allow the first spare optical element to provide a desired correction of the image quality of the projection objective (e.g., to compensate for differences in the optical effect of the first spare optical element versus the optical element which is replaced by the first spare optical element). Working the first spare optical element may also be used to alter the image quality of the projection objective compared to the image quality of the projection objective in its original state.

In certain embodiments, the first optical element is removed, worked and then put back into the projection objective. In such embodiments, the first spare optical element is the first optical element but in an altered form due to process of being worked (e.g., with material defects removed from the optical element or its coating). An optical element of a projection objective can be very expensive, and re-using an optical element after it is removed and worked can assist in significantly reducing the cost of repairing of the projection objective.

To reduce downtime of the projection objective (e.g., if the first optical element is reused as the first spare optical element after being worked), it may be desirable for the first spare optical element to be chosen from a pool of optical elements. The pool of optical elements may have been removed from other projection objectives and may have been worked according to one or more of the above-mentioned working processes. For example, a plurality of first optical elements which have been removed from a plurality of projection objectives can be re-worked and kept in supply and exchanged in a subset of projection objectives.

Working an optical element can reduce the thickness of the optical element. The reduced thickness of the optical element may lead to a significant alteration of the optical effect of the optical element when re-inserted in the projection objective compared with the original state of the optical element. But, this difference can be compensated for. As an example, prior to inserting the optical element as a spare optical element into the projection objective, the optical element can be provided with an aspherical surface shape or a non-rotationally symmetric surface shape suited for correcting the difference. Alternatively or additionally, all or some of the optical elements can be re-positioned ("set-up").

In some embodiments, the first spare optical element is an essentially identical optical element as the first optical element in its original state (prior to degradation).

In certain embodiments, adjusting an image quality includes measuring an image quality and adjusting the image quality by moving and/or deforming an optical element. The optical element that is moved and/or deformed can be, for example, the first spare optical element.

In some embodiments, the method includes selecting a second optical element from the plurality of optical elements, removing the second optical element from the projection objective and inserting a second spare optical element into the projection objective where the second optical element was located prior to its removal. The second spare optical element can be worked and/or chosen depending on the difference between the actual image quality obtained by a measurement and the desired image quality.

Using a second spare optical element can be advantageous, for example, if the image quality of the projection objective, after replacement of the first optical element by a spare optical element, cannot be fully adjusted to the desired image quality. The second spare optical element can provide further degrees of freedom of correction of the projection objective. In some embodiments, it may not be possible to work the first spare optical element or working the first spare optical element may not result in a desired image quality. For example, the first spare optical element may have material inhomogeneity errors that cause deviations from the desired image quality. In such instances, the second spare optical element can be designed to allow machining of its surfaces and/or can be more easily chosen with a desired index distribution and can be used as a correction element for adjusting a desired image quality. This can be especially advantageous if the first spare optical element is the last optical element next to the image plane (e.g., in an immersion projection objective), or the penultimate optical element (e.g., in a double immersion projection objective).

It may also be desirable if, prior to inserting the second spare optical element into the projection objective, the second spare optical element is worked. Optionally, working the second spare optical element can include altering the material thickness of the second spare optical element. Altering the material thickness of the second spare optical element has proved to be a suitable correction mechanism when the first spare optical element has a reduced thickness compared with the first optical element in its original state. Optionally, working the second spare optical element includes providing at least one surface of the second spare optical element with an aspherical surface shape or a non-rotationally symmetric surface shape. Providing the second spare optical element with an aspherical or even non-rotational symmetric surface shape can improve the ability to adjust the image quality as desired.

In certain embodiments, the method includes, after inserting the first spare optical element, and prior to working the second spare optical element, measuring the image quality of the projection objective in the field, calculating a correction profile for the second spare optical element depending on the measured image quality, and working the second spare optical element depending on the calculated correction profile. This "two-step" process can be particularly advantageous, for example, if the first spare optical element is sensitive to deformations when being inserted into the projection objective. By inserting the first spare optical element into the projection objective, deformations of the first spare optical element can occur which cannot be pre-simulated prior to the insertion of the first spare optical element. In this case, it is advantageous to first insert the first spare optical element into the projection objective, to measure the image quality of the projection objective, and then to calculate a correction profile desired for the second spare optical element to obtain the desired image quality. Thus, image defects caused by the insertion process of the first spare optical element are taken into account when calculating the correction profile for the second spare optical element. After working the second spare optical element, the second spare optical element is inserted into the projection objective.

In some embodiments, the second spare optical element is worked depending on the desired image quality based on a simulation of the optical effect of the first spare optical element, and thereafter the first and second spare optical elements are inserted into the projection objective. This "one-step" process can be advantageous by involving less time and can be used, for example, if the first spare optical element has relatively little or no sensitivity to deformation when being inserted into the projection objective.

In certain embodiments, adjusting of the image quality includes at least approximately maintaining the image quality prior to the degradation of the optical system. In such embodiments the fingerprint of the projection objective can be at least approximately unaltered by the revision/repairing process.

It some instances, adjusting the image quality can include altering the image quality compared to the image quality prior to the degradation of the optical system (e.g., increasing or decreasing a specific image defect). For example, in certain instances, a customer may want to increase an image defect (e.g., coma) for certain lithography exposure processes.

In some embodiments, several spare parts may be provided with individual correction surfaces to establish several lithography apparatuses with essentially identical optical performance (e.g., an illumination setting of the projection exposure apparatus and/or the object to be imaged by the projection objective).

In certain embodiments, adjusting the image quality includes adjusting the position and/or shape of at least one of the optical elements in the projection objective. Adjusting the position of an optical element can include an x-, y-, and/or z-translational and/or rotational positioning via suitable actuators or manipulators. In some cases, the shape of an optical element can be changed (e.g., deformed by actuators or manipulators). Alternatively or additionally the manipulators can change the index distribution of the optical element (e.g., if the optical element is a refractive optical element). This can be achieved by heating and/or cooling, squeezing or bending the refractive element.

In some embodiments, the first optical element is the last lens element next to the image plane where, in case of an immersion projection objective, the immersion liquid does not count as an optical element.

In certain embodiments, the first optical element is the penultimate lens element in a double immersion projection objective.

In some embodiments, the last lens element of an immersion projection objective can be subject to degradation (e.g., due to a contact with an immersion liquid or by scratching the coating).

In certain embodiments, the last lens can undergo degradation due to the large power concentration close to the image. This lens may be a relatively thick lens with large curvature on the entrance side and optionally a plane surface next to the image plane.

In some embodiments, the second optical element is an element without refractive power, such as a plane-parallel plate. If the projection objective is a double immersion type projection objective, the second optical element can be a plane-parallel plate which located in between the two immersion liquids.

It can be advantageous to use a plane-parallel plate as the second optical element to be selected as a correction element because it can be easier to provide such an element with a correction surface compared to optical elements having a concave and/or convex surface.

In certain embodiments, the second optical element can be arranged at a location near a field plane or near a pupil plane of the projection objective. A plane-parallel plate in a location near a field plane can be particularly sensitive to field-dependent image defects and thus capable of correcting such image defects, and a plane-parallel plate positioned near a pupil plane can be particularly capable of correcting image defects which are at least approximately constant over the field.

In some embodiments, it may be particularly desirable, if there are two optical elements selected as correction elements, for one of the optical elements to be near a field plane and for the other optical element to be near a pupil plane of the projection objective.

The disclosure also provides a revised/repaired projection objective. The disclosure further provides a system that includes components used in the revision/repair methods.

Further advantages and features will become apparent from the following description, the drawings and the claims. It is to be understood that the features described herein are not only applicable in the combinations given, but also in other combinations or in isolation, without departing from the scope of the disclosure.

BRIEF DESCRIPTION OF THE DRAWINGS

Exemplary embodiments are shown in the drawings and will be described hereinafter with reference thereto, in which.

DETAILED DESCRIPTION

Figure 1:
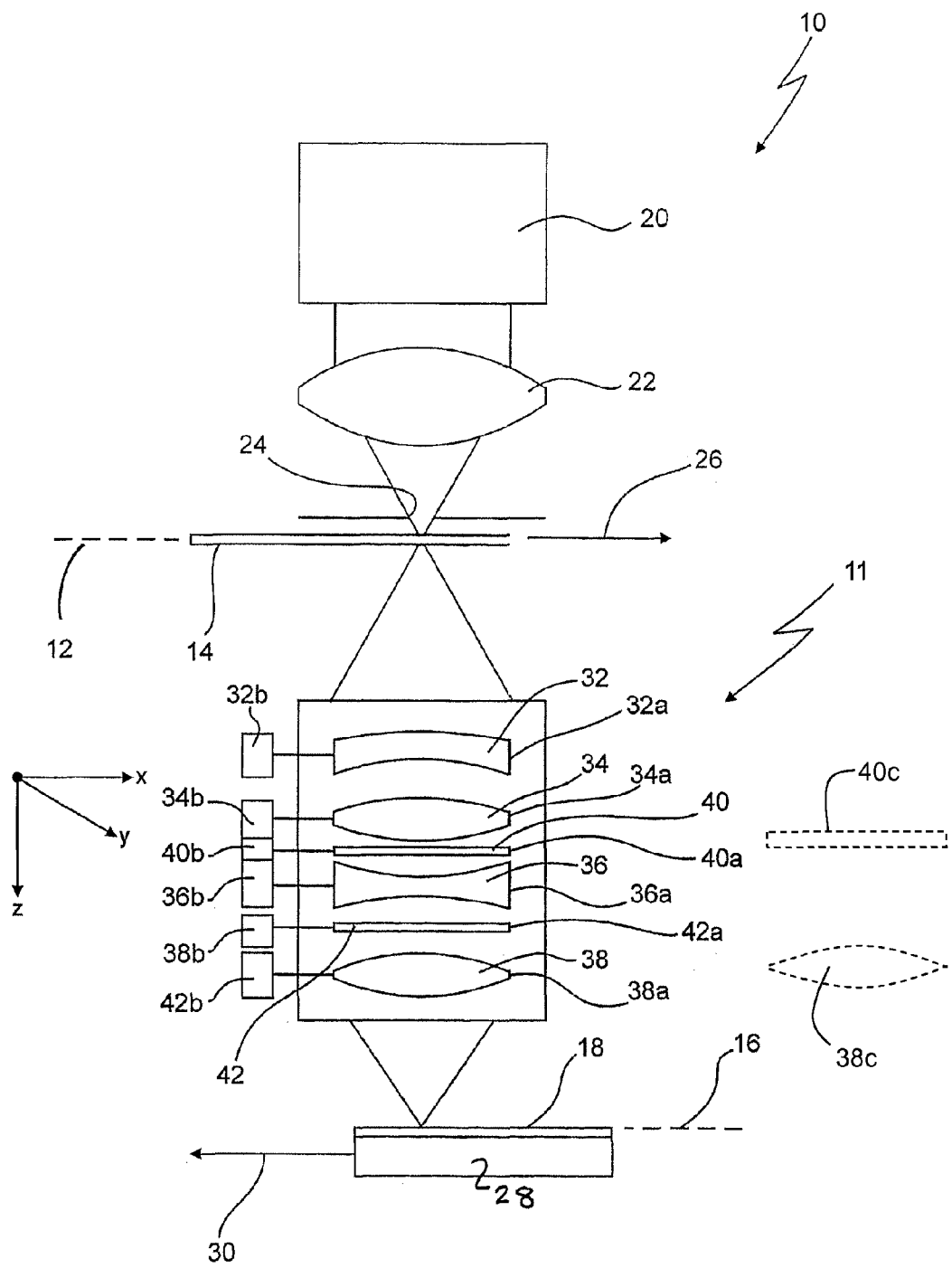
FIG. 1 schematically shows a lithography exposure apparatus including a projection objective.

FIG. 1 schematically shows a lithography projection exposure apparatus generally labeled with reference numeral 10. The projection exposure apparatus 10 can be used, for example, in a microlithographical process of manufacturing semiconductor devices.

The projection exposure apparatus 10 includes a projection objective 11 which images an object (reticle) 14 which is arranged in an object plane 12 of the projection objective 11 onto a substrate 18 (wafer) arranged in an image plane 16 of the projection objective 11. The light for imaging the object 14 onto the substrate 16 is produced by a light source 20 (for example a laser) and is directed onto the object 14 via an illumination optics 22, after which the light enters the projection objective 11.

Imaging of the object 14 onto the substrate 18 is performed in a so-called scan-process in which the light from the illumination optics 22 is directed through a scanning slot 24, a width of which is less than the dimension of the object 14 onto the object. The object 14 is displaced in a scan direction 26 to progressively project the whole object 14 onto the substrate 18, while the substrate 18 arranged on a stage 28 is displaced in a direction 30 opposite to the scan direction 26.

The projection objective 11 includes a plurality of optical elements arranged in direction of the propagation of the light (z-direction) through the projection objective 11. In the embodiment shown, the projection objective 11 includes six optical elements, four of which are optical elements having a refractive power, namely optical elements 32, 34, 36 and 38. The remaining two optical elements 40 and 42 are optical elements without refractive power, and are depicted as plane-parallel plates in FIG. 1.

It is to be understood that the number of optical elements can be more or less than six. Further, the shapes of the optical elements are not restricted to the shapes shown. Typically, more than six lenses and at least one mirror are used in immersion lithography. The number and shape of optical elements is determined by the desired imaging performance. In some embodiments, a wavefront aberration of less than 1 nm rms is desired over an imaging field of approximately 10×30 mm when, for example, using light with a wavelength of 248 nm or 193 nm and when the numerical aperture of the projection objective 11 is well above 0.9, such as up to 1.3 (which can be possible with immersion liquids like water).

The optical elements 32 through 42 are held in mounts 32a through 42a so that the position of each of elements 32 through 42 can be adjusted using its respective mount 32a through 42a.

Some of the optical elements 32 through 42 (e.g., each of optical elements 32 through 42) are assigned corresponding actuators or manipulators 32b through 42b to adjust the position of the optical elements. The actuators or manipulators can be capable of positioning the optical elements 32 through 42 in the x-, y- and/or z-directions according to the coordinate system shown in FIG. 1. It is to be understood that not only translational movements are possible, but that rotational movements about the x-, y- and/or z-axis are also possible. Further, some of the optical elements 32 through 42 may be configured as actively deformable elements (e.g., an actively deformable element that is a refractive optical element). Optionally, if an optical element is a refractive optical element, its corresponding actuator or manipulator can be configured to deform the optical element to change the index distribution of the optical element.

After a certain time of use the projection objective 11, the refractive power of one or more of the optical elements 32 through 42 (e.g., optical elements 32 through 38) may degrade.

For example, if the projection objective 11 is used in immersion lithography, the last optical element 38 is in contact to an immersion liquid (not shown) which may be aggressive to the coating and bulk material of the optical element 38. After a certain time, the optical element 38 can be degraded to an extent that the projection objective 11 has to be repaired.

Figure 2:
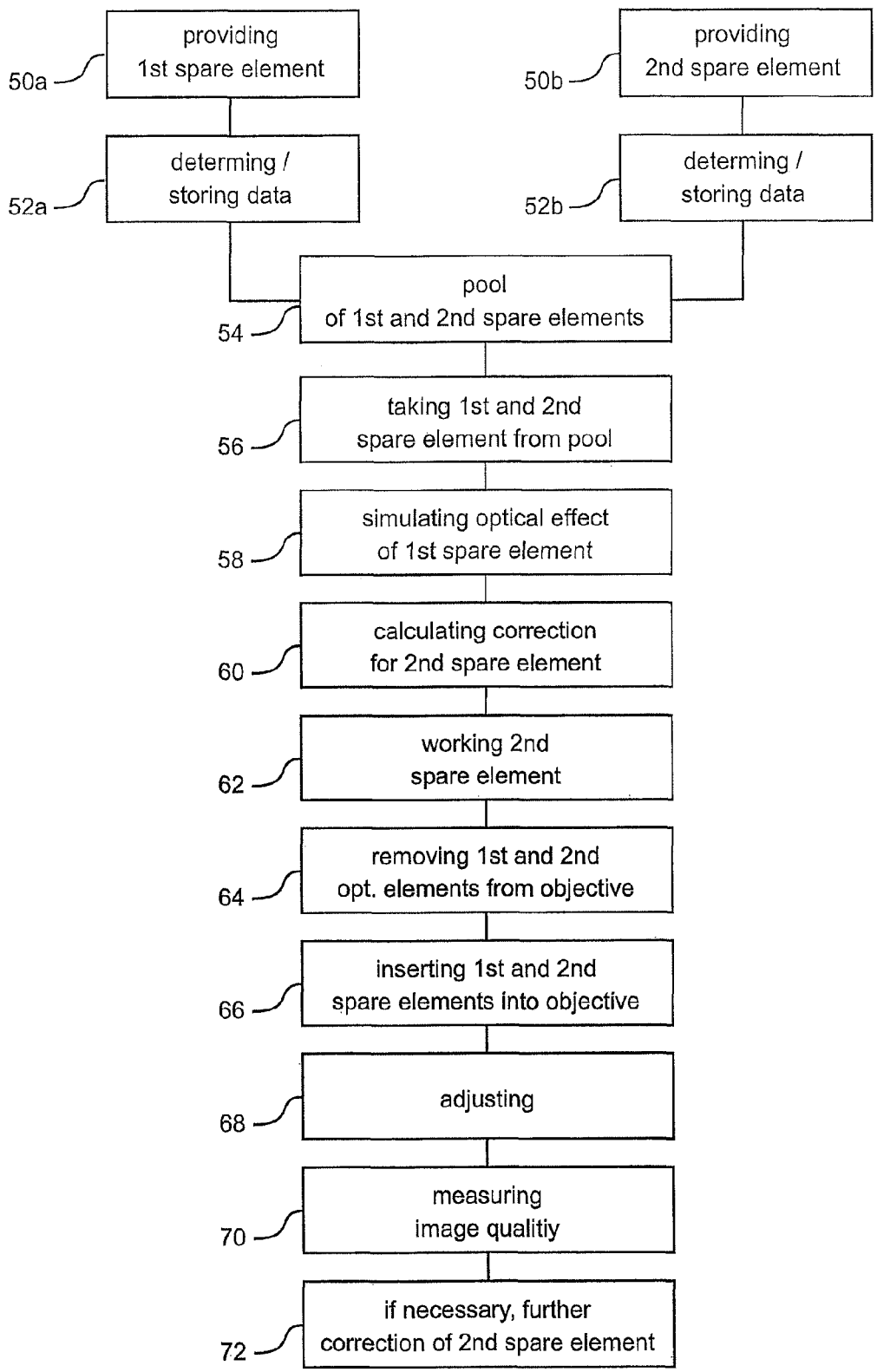
FIG. 2 shows a flow chart of a method for revising/repairing the projection objective in FIG. 1.

FIG. 2 shows a method for repairing the projection objective 11. The method to be described below can be performed in the field, i.e. at the customer's location and without exchanging all of the optical elements 32 through 42, but may involve only the exchange of two of the optical elements 32 through 42. These optical elements may be the degraded optical element 38 and one of the optical elements 40 and 42 (referred to below as the second optical element).

The method for repairing the projection objective 11 includes at 50a providing at least one, optionally a plurality of first spare optical elements which can be used as replacement for the optical element 38. Accordingly, the spare optical element(s) is(are) designed and manufactured in accordance with the optical element 38 which is to be replaced after degradation. At 52a, all data relevant to the exchange of the optical element 38 by the first spare optical element(s) are determined and stored.

At 50b and 52b, one or more spare optical elements are provided, and their data relevant to the exchange process are determined and stored. In the following description, it is assumed that the second spare optical element is used as replacement of the second optical element 40.

At 54, all first and second spare optical elements are collected in a pool in order to reduce the time of response when an actual repairing process is to be carried out in the field.

If repairing is desired, a first spare optical element 38c and a second spare optical element 40c are taken from the pool as indicated with reference numeral 56.

Next, at 58, the difference of the optical effect of the first spare optical element compared with the first optical element 38 in the original state of the projection objective 11 is simulated. It is to be noted that even though the first spare optical element is designed and manufactured in accordance with the first optical element 38 to be replaced, it is not possible to provide the first spare optical element with characteristics which are absolutely identical with the characteristics of the first optical element 38 in its original state. Therefore, there will be some difference in the optical effect between the first spare optical element and the first optical element in its original state.

Based on the result of the simulating step at 58, a correction surface shape is calculated which the second spare optical element should have in order to correct or compensate the difference in the optical effects of the first spare optical element versus the first optical element 38.

The correction surface shape usually is an aspherical shape or a non-rotationally symmetric shape.

At 62, the second spare optical element is worked, for example machined in order to provide the second spare optical element with the correction surface shape as calculated in step 60.

It is to be noted that a correction surface may also be provided on the first spare optical element, if the first spare optical element can be so worked (e.g., machined). However, in some instances, such as if the first spare optical element is made from a material which is difficult to be worked (e.g., to be machined) as it is the case for calcium fluoride, a working process is not possible or at least not to an extent which may be desired for correcting image defects caused by the difference in the optical effect between the first spare optical element and the first optical element 38 to be replaced.

Next, the first spare optical element and the second spare optical element are transported to the customer.

At 64, the first optical element 38 and the second optical element 40 are removed from the projection objective 11.

At 66, the first and second spare optical elements are inserted into the projection objective, at the location where the respective optical elements were arranged prior to their removal from the projection objective 11.

At 68, the image quality of the projection objective 11 is adjusted, such as by using the actuators or manipulators 32b through 42b in order to adjust a desired image quality.

At 70, the actual image quality is measured, whereafter another adjusting step can follow. If the desired image quality cannot be adjusted solely by positioning and/or deforming all or some of the optical elements 32 through 42, then another correction of the second spare optical element can be performed, wherein it is possible to remove the previously inserted second spare optical element from the projection objective 11 again and to correct it or to provide another second spare optical element previously worked in accordance with the desired image quality as replacement for the actual second spare optical element.

The method for repairing the projection objective 11 described before is a "one-step" process.

Figure 3:
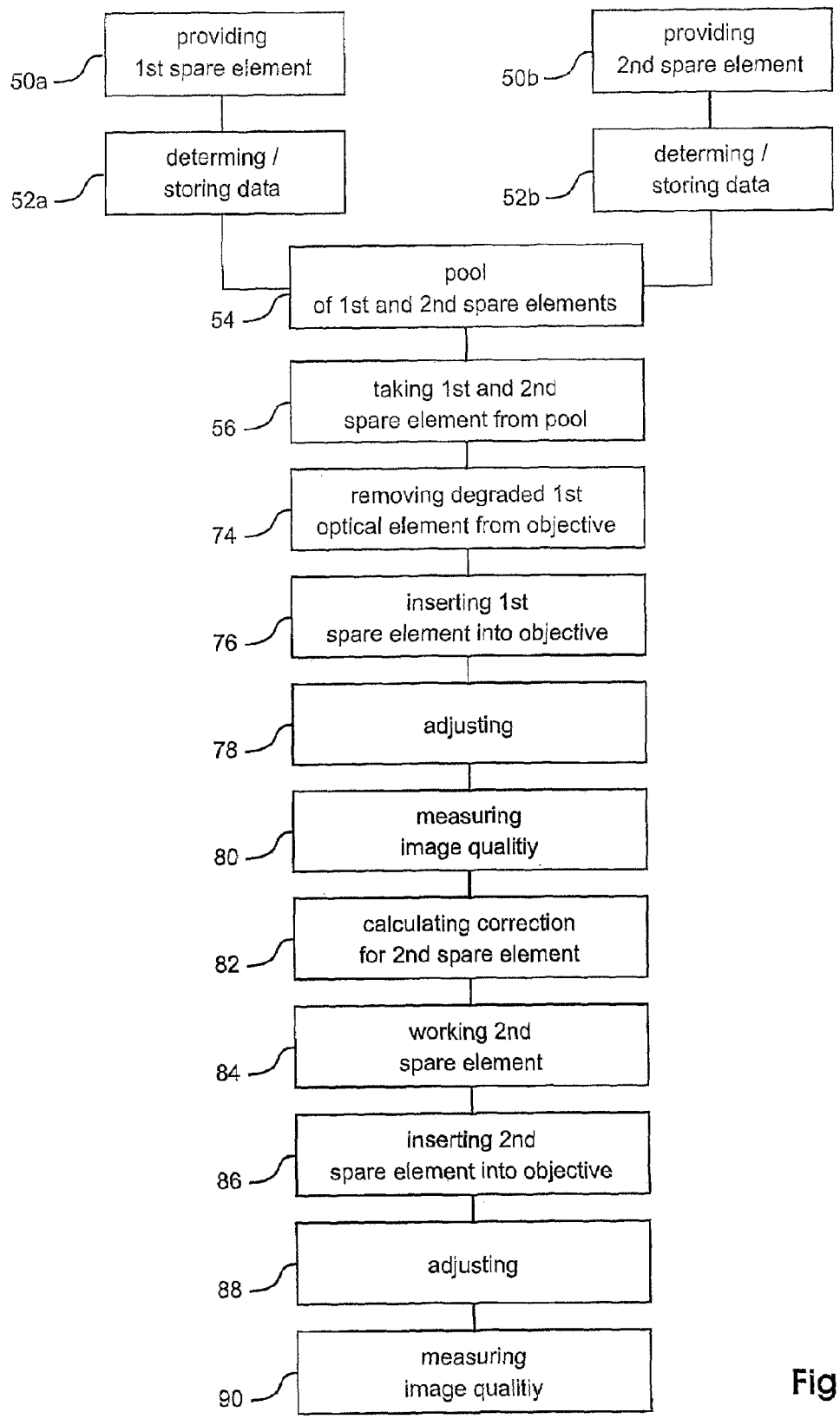
FIG. 3 shows a flow chart of a method for revising/repairing the projection objective in FIG. 1.

With reference to FIG. 3, a "two-step" repairing process will be described in the following.

Steps 50a, 50b, 52a, 52b, 54 and 56 are identical with the corresponding steps of the method described before. While step 58 in FIG. 2 has been omitted in FIG. 3, step 58 can also be used in the method according to FIG. 3.

The difference between the method according to FIG. 3 and the method according to FIG. 2 is that the correction to be provided by the second spare optical element is not calculated prior to, but after the insertion of the first spare optical element into the projection objective 11.

Therefore, at 74, the degraded first optical element (optical element 38) is removed from the projection objective 11. At 76, the first spare optical element is inserted into the projection objective 11 at the location where the first optical element (optical element 38) was arranged in the original state.

Next, the first spare optical element is adjusted in position (at 78), and the image quality is measured (at 80).

At 82, the desired correction to be provided by the second spare optical element is calculated on the basis of the results of the previous measuring step.

The advantage of this procedure is that in case that the first spare optical element was deformed when being inserted into the projection objective 11, such deformations which contribute to image defects of the projection objective 11, are involved in the calculation of the desired correction to be provided by the second spare optical element. Furthermore, while the calculation step 60 in the method according to FIG. 2 is only based on the simulation of the difference of the optical effect of the first spare optical element versus the first optical element to be replaced, the calculation step 82 also includes the optical performance of the whole projection objective 11, i.e. of the optical effect of all optical elements 32 through 42. Especially, differences in the refractive index distribution of the first spare optical element may be distracting, such that the simulation of the optical performance of the optical system with the first spare optical element might be impossible with the desired accuracy. Therefore it might be advantageous first to measure after insertion of the first spare optical element the optical performance and second to calculate a correction surface of a second spare element.

At 84, the second spare optical element is worked on the basis of the calculation step 82 (e.g., machined) in order to provide the second spare optical element with a correction surface shape which usually will be an aspherical or even non-rotational symmetric surface shape.

At 86, the second spare optical element is inserted into the projection objective 11, and the projection objective 11 is adjusted (at 88) and the image quality is measured again at 90. Normally, the method according to FIG. 3 need not involve a repetition of the correction of the second spare optical elements, because the calculation step 82 has been performed after insertion of the first spare optical element into the projection objective 11.

It is to be noted that the adjusting of the image quality of the projection objective 11 may not only directed to the purpose of maintaining the image quality of the projection objective 11 prior to the degradation of one or more of the optical elements 32 through 42, but can be directed to an altering of the image quality. Depending on the desired performance of the projection objective 11, it can be desired by the customer to increase and/or decrease certain image defects, for example to introduce or increase coma, which may be useful for a specific illumination setting or a specific object (reticle) to be imaged by the projection objective 11.

In the following, modifications of the methods according to FIGS. 2 and 3 will be described.

As already described with respect to FIGS. 2 and 3, it can be desirable if a plurality of first and second spare optical elements are kept in supply in a pool as shown with reference numeral 54 in FIGS. 2 and 3. Further, it has been described above that the first and second spare optical elements kept in supply in the pool are freshly manufactured elements. However, it is also conceivable to build up at least the pool of first spare optical elements from those optical elements which have been removed from existing projection objectives which have been re-worked for re-use in the same or other projection objectives.

In order to be more precise, the following embodiment of a repairing process can be applied.

Starting from the projection objective 11 in FIG. 1, the degraded first optical element 38 is removed from the projection objective 11.

Next, the first optical element 38 is re-worked in order to remove coating and/or material defects from the optical element. Such a re-working can be done by machining the first optical element 38 after removal from the projection objective 11.

Normally, such a working or re-working of the first optical element 38 leads to a significant reduction of the thickness, such as in the center of the first optical element. Experiments have shown that a thickness reduction in the range of several μm to more than 100 μm can occur in such a re-working procedure when material defects are removed.

The significant reduction of the thickness of the re-worked first optical element 38 when re-used as the first spare optical element in the same projection objective 11 or another projection objective of the same kind as the projection objective 11 may lead to a significant alteration of the image quality of the projection objective.

Therefore, when the re-worked first optical element is used as the first spare optical element in the projection objective 11 or another projection objective, measures for correcting image defects caused by the significant material thickness reduction are desired.

The following correction processes and combinations thereof can be performed.

One of the correction processes involves using the actuators or manipulators 32b through 42b in order to re-adjust the position of the optical elements 32 through 42, optionally using all degrees of freedom of movement of the optical elements 32 through 42 including translational and rotational degrees of freedom of movement, and if provided deformations.

Another correction process involves working the re-worked first optical element reduced in thickness such that it is provided with an aspherical surface shape.

Still another correction process involves selecting a second optical element of the plurality of optical elements 32 through 42, for example the optical element 40 and/or the optical element 42 and providing it with an aspherical correction surface or a non-rotationally symmetric correction surface.

Alternatively or in addition to the previous correction process, the second optical element which has been provided with an aspherical correction surface e or a non-rotationally symmetric correction surface, or another optical element of the plurality of optical elements 32 through 42, is worked such that its thickness is altered (e.g., reduced to compensate image defects caused by the thickness reduction of the first optical element 38).

Optionally, a combination of the above-mentioned correction processes is performed, simultaneously or step by step.

Figure 4:
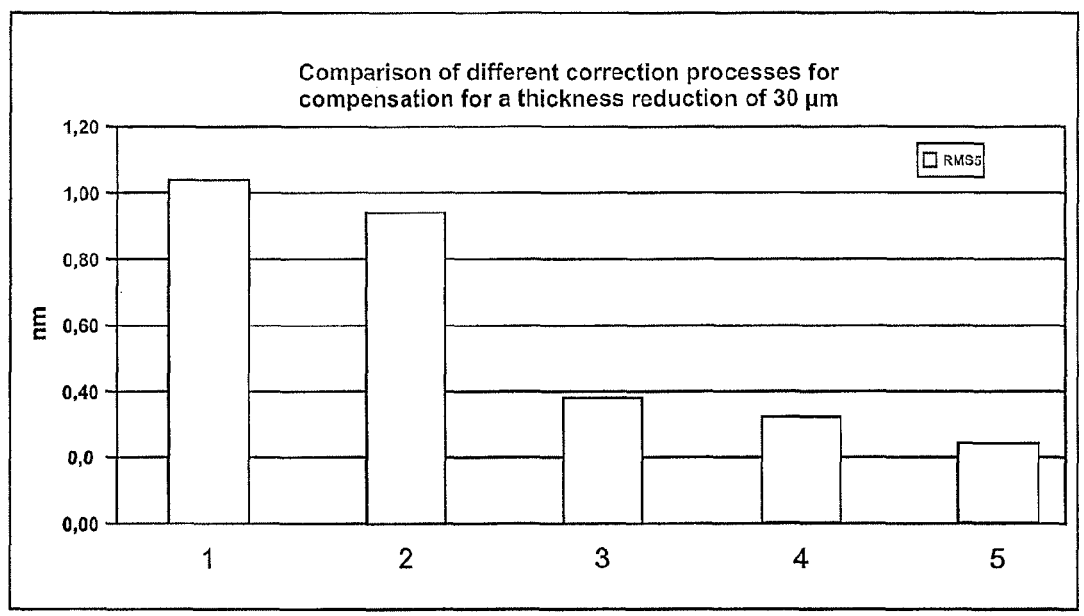
FIG. 4 shows a diagram for illustrating the effect of different correction processes after exchange of an optical element in a projection objective.

FIG. 4 shows a diagram in which columns indicate residual image defects depending on the correction process applied. The first optical element 38 has been worked such that its thickness was reduced by about 30 μm. Without any correction for compensating for the thickness reduction, the maximum of the RMS Z5 over the field was more than 110 nm.

The first column in FIG. 4 shows the residual RMS Z5 after using the first correction process above using a re-positioning of the optical elements 32 through 42. Hence RMS Z5 has been reduced by one order of magnitude.

The second column shows the residual RMS Z5 after using the correction process used in the first column and additionally using a thickness variation of a second optical element. The third column shows the residual RMS Z5 after a correction process using the set-up (first column) and additionally using an aspherical correction surface on the first optical element 38 itself.

The fourth column shows the residual RMS Z5 after using a correction process using the set-up (first column) and additionally using an aspherical correction surface on the second optical element.

Finally, the fifth column shows the residual RMS Z5 using a combination of all correction processes according to columns 1 through 4. The final wavefront error Z5 is well below an acceptable limit of 0.3 nm RMS.

FIG. 4 shows that it is possible to compensate for image defects caused by a significant thickness reduction of the re-worked and re-inserted first optical element without necessitating an exchange of more than two optical elements in the projection objective 11.

Further, with respect to the foregoing embodiments, it is to be noted that two second optical elements can be provided in the projection objective 11 which can be selected as correction elements after an exchange of an optical element of the optical elements 32 through 38 having refractive power.

In some embodiments, one of the second optical elements 40 can be arranged at a location near a field plane, and the other of the second optical elements 40, 42 can be arranged at a location near a pupil plane of the projection objective 11 so that it is possible to compensate image defects having a field dependence as well as correcting image defects which are substantially constant over the field.

Figure 5:
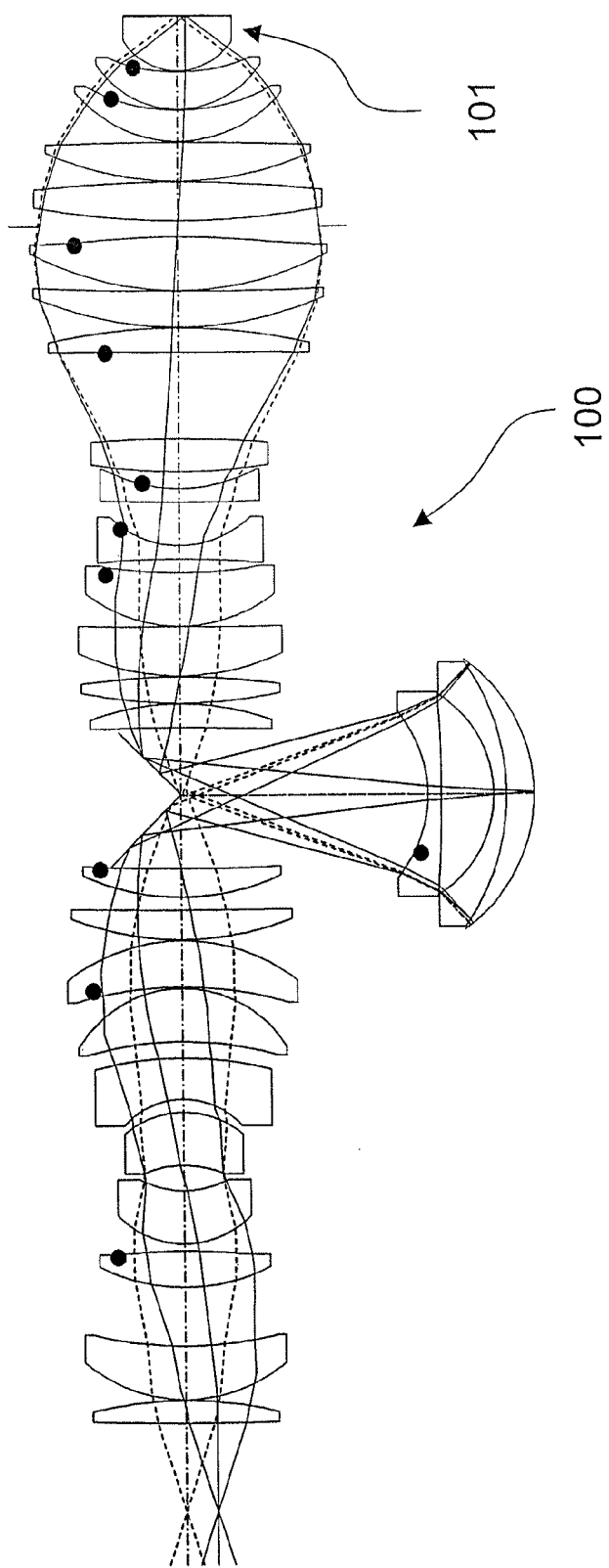
FIG. 5 shows a design of an immersion catadioptric projection objective.

FIG. 5 shows a design of a catadioptric projection objective of immersion type 100 where the optical element 101 is referred to be the first optical element. In some embodiments, the optical element 101 is made of $CaF_2$, $BaF_2$, LiF, LUAG or Spinel or it is mixed crystal of those. The lenses and/or mirrors which are marked with a dot are those which are aspherical.

Figure 6:
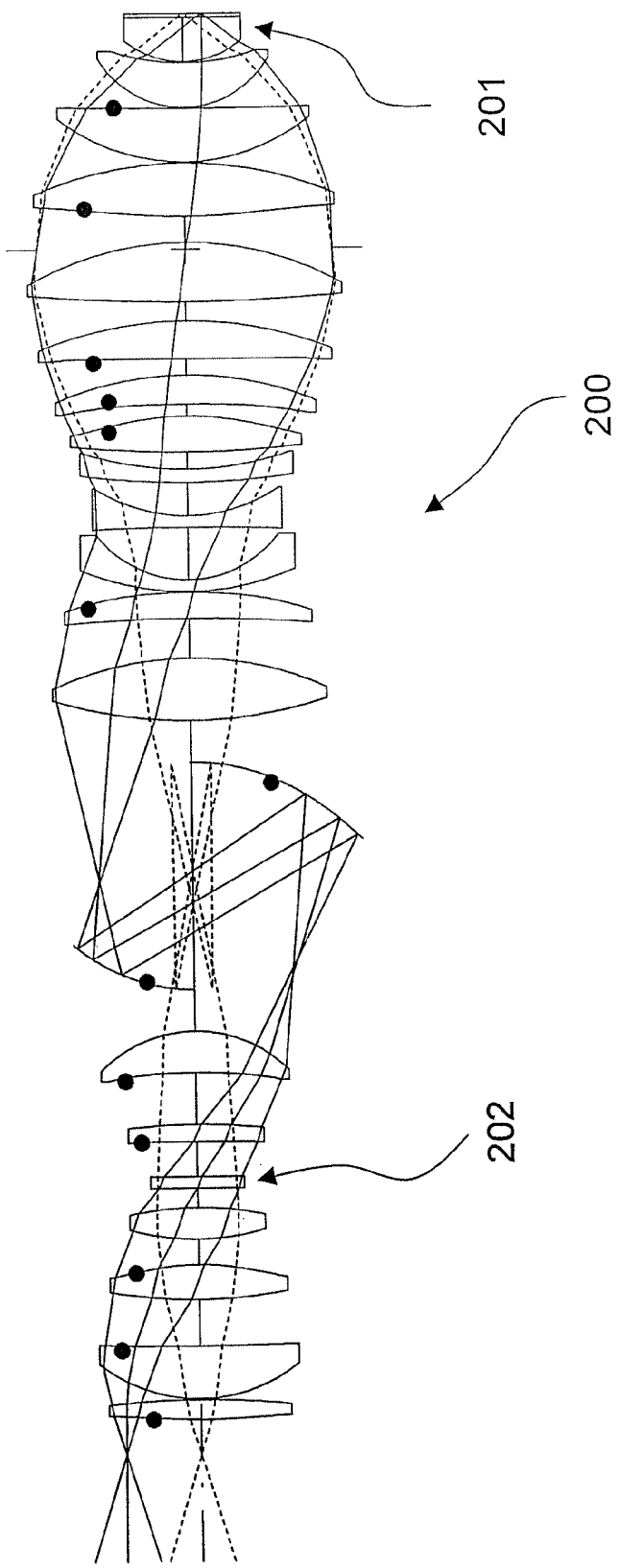
FIG. 6 shows another design of an immersion catadiotric projection objective.

FIG. 6 shows another design of a catadioptric projection objective of immersion type 200 where the optical element 201 is referred to be the first optical element and the optical element 202 is a plane-parallel plate which is referred to be the second optical element. The second optical element is situated in a pupil plane of the projection objective. The lenses and/or mirrors which are marked with a dot are those which are aspherical.

Figure 7:
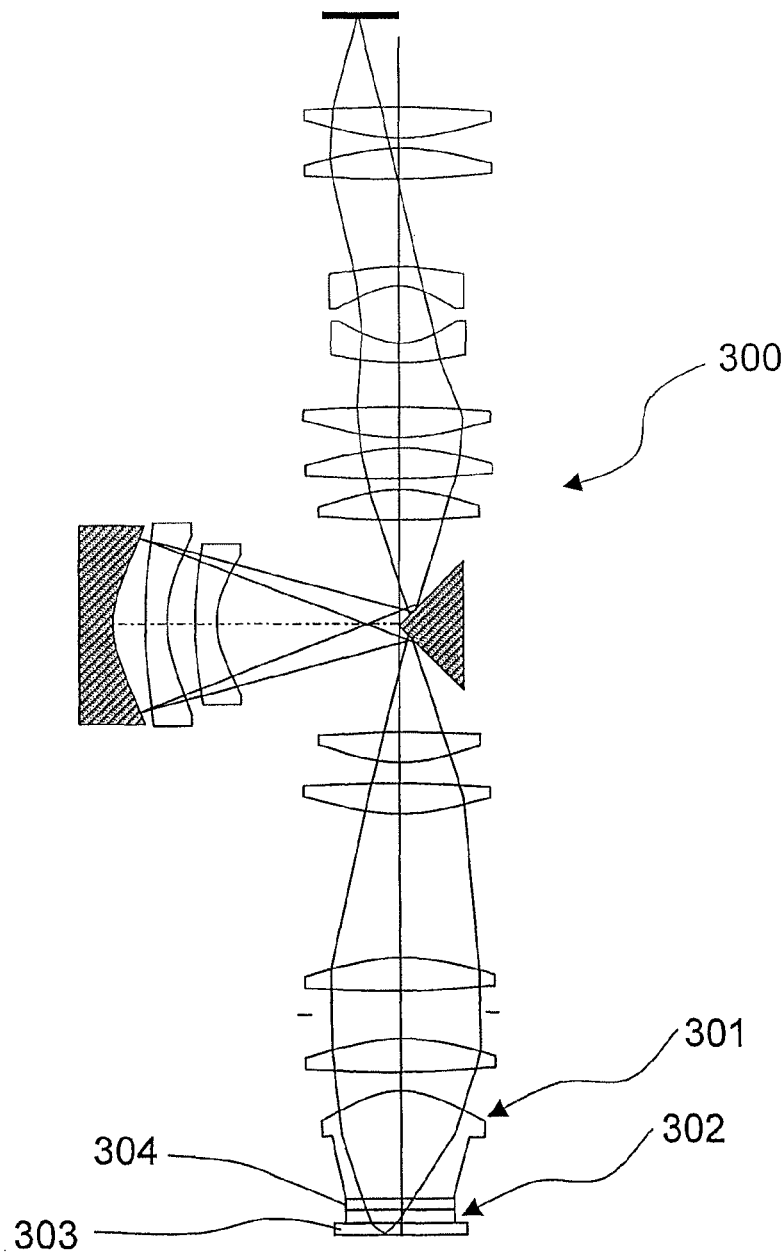
FIG. 7 shows a double immersion catadioptric projection objective.

FIG. 7 shows a projection objective of double immersion type 300 where the optical element 301 is referred to be the first optical element and the optical element 302 is a plane-parallel plate which is referred to be the second optical element. The second optical element is situated near a field plane of the projection objective. The two immersion liquids are 303 and 304. Even though there are no dots as in the last two figures there may be aspherical lenses and/or mirrors in this projection objective as well.

What is claimed is:

1. A method, comprising:
   providing a projection objective of a lithography projection exposure apparatus, the projection objective comprising a plurality of optical elements between an object plane of the projection objective and an image plane of the projection objective, the plurality of optical elements comprising a first optical element having a refractive power, the first optical element being disposed in the projection objective at a first location;
   removing the first optical element from the projection objective;
   working the first optical element to provide a first spare optical element; and
   inserting the first spare optical element into the projection objective at the first location,
   wherein the removing and inserting steps are performed at a location of use of the lithography projection exposure apparatus in a lithography process, and wherein working the first optical element comprises providing at least one surface of the first spare optical element with an aspherical shape or a non-rotationally symmetric shape.

2. The method of claim 1, further comprising, after inserting the first spare optical element, adjusting an image quality of the projection objective to a desired quality.

3. The method of claim 1, wherein the method is performed without exchanging all of the optical elements of the projection objective.

4. The method of claim 1, wherein working the first optical element comprises machining the first optical element.

5. The method of claim 1, wherein working the first optical element reduces its thickness.

6. The method of claim 1, wherein the first spare optical element is essentially identical to an original state of the first optical element.

7. The method of claim 2, further comprising, prior to adjust adjusting the image quality of the projection objective, measuring the image quality of the projection objective.

8. The method of claim 2, wherein adjusting the image quality of the projection objective comprises moving a second optical element of the plurality of optical elements.

9. The method of claim 2, wherein adjusting the image quality of the projection objective comprising deforming a second optical element of the plurality of optical elements.

10. The method of claim 2, wherein a second optical element of the plurality of optical elements is a refractive optical element, and adjusting the image quality of the projection objective comprises changing an index distribution of the second optical element.

11. The method of claim 1, wherein the projection objective is an immersion projection objective.

12. The method of claim 1, wherein the projection objective is a double immersion type projection objective.

13. The method of claim 1, wherein the first optical element comprises a material selected from the group consisting of $BaF_2$, LiF, $BaLiF_3$, LUAG and Spinel.

14. The method of claim 1, further comprising:
   selecting a second optical element from the plurality of optical elements, the second optical element being disposed in the projection objective at a second location;
   removing the second optical element from the projection objective; and
   inserting a second spare optical element into the projection objective at the second location.

15. The method of claim 14, wherein a design of the second spare optical element depends on a difference between an actual image quality of the projection objective and a desired image quality of the projection objective.

16. The method of claim 14, further comprising, prior to inserting the second spare optical element into the projection objective, working the second spare optical element.

17. The method of claim 16, wherein working the second spare optical element comprises altering a material thickness of the second spare optical element.

18. The method of claim 16, wherein working the second spare optical component comprises providing at least one surface of the second spare optical element with an aspherical shape or a non-rotationally symmetric shape.

19. The method of claim 14, comprising, after removing the second optical element, working the second optical element to provide the second spare optical element.

20. The method of claim 14, further comprising:
   after inserting the first spare optical element and before inserting the second spare optical element, measuring an image quality of the projection objective in the field; and after measuring the image quality of the projection objective, inserting the second spare optical element into the projection objective.

21. The method of claim 20, further comprising, after measuring the image quality of the projection objective, calculating a correction profile for the second spare optical element depending on the measured image quality.

22. The method of claim 21, further comprising working the second spare optical element depending on the calculated correction profile.

23. The method of claim 14, further comprising working the second spare optical element depending on a desired image quality based on a simulation of the optical effect of the first spare optical element.

24. The method of claim 23, further comprising, after working the second spare optical element, inserting the first and second spare optical elements into the projection objective.

25. The method of claim 14, wherein the second optical element comprises a material selected from the group consisting of $BaF_2$, LiF, $BaLiF_3$, LUAG or Spinel.

26. The method of claim 1, wherein:
the projection objective has an initial image quality;
the projection objective has a second image quality after at least one of the optical elements degrades, the second image quality being different from the initial image quality; and
the projection objective has a third image quality after the first spare optical element is inserted therein, the third image quality being at least approximately the same as the initial image quality.

27. The method of claim 1, wherein:
the projection objective has an initial image quality;
the projection objective has a second image quality after at least one of the optical elements degrades, the second image quality being different from the initial image quality; and
the projection objective has a third image quality after the first spare optical element is inserted therein, the third image quality altered relative to the initial image quality.

28. The method of claim 27, wherein altering the image quality of the projection objective comprises increasing at least one specific image defect according to an operational parameter of the projection objective and/or decreasing at least one specific image defect according to an operational parameter of the projection objective.

29. The method of claim 28, wherein the operational parameter comprises a parameter selected from the group consisting of an illumination setting of the projection exposure apparatus, and an object to be imaged by the projection objective.

30. The method of claim 2, wherein adjusting the image quality comprises adjusting a parameter selected from the group consisting of a position at least one of the plurality of optical elements and a shape of at least one of the plurality of optical elements.

31. The method of claim 1, wherein the first optical element is the optical element in the projection objective that is closest to the image plane of the projection objective.

32. The method of claim 14, wherein the second optical element is the optical element in the projection objective that is closest to the image plane of the projection objective.

33. The method of claim 14, wherein the second optical element is an element without refractive power.

34. A method, comprising:
providing a projection objective of a lithography projection exposure apparatus, the projection objective comprising a plurality of optical elements between an object plane of the projection objective and an image plane of the projection objective, the plurality of optical elements comprising a first optical element having a refractive power, the first optical element being disposed in the projection objective at a first location, the method comprising;
removing the first optical element from the projection objective;
working the first optical element to provide a first spare optical element;
inserting the first spare optical element into the projection objective at the first location; and
after inserting the first spare optical element, adjusting an image quality of the projection objective to a desired quality,
wherein working the first optical element comprises providing at least one surface of the first spare optical element with an aspherical shape or a non-rotationally symmetric shape.

35. A method, comprising:
providing a projection objective of a lithography projection exposure apparatus, the projection objective comprising a plurality of optical elements between an object plane of the projection objective and an image plane of the projection objective, the plurality of optical elements comprising a first optical element having a refractive power, the first optical element being disposed in the projection objective at a first location, the method comprising;
removing the first optical element from the projection objective;
working the first optical element to provide a first spare optical element; and
inserting the first spare optical element into the projection objective at the first location,
wherein the method is performed without exchanging all of the optical elements of the projection objective, and wherein working the first optical element comprises providing at least one surface of the first spare optical element with an aspherical shape or a non-rotationally symmetric shape.

36. A method, comprising:
providing a projection objective of a lithography projection exposure apparatus, the projection objective comprising a plurality of optical elements between an object plane of the projection objective and an image plane of the projection objective, the plurality of optical elements comprising a first optical element having a refractive power and a thickness, the first optical element being disposed in the projection objective at a first location;
removing the first optical element from the projection objective;
inserting a first spare optical element into the projection objective at the first location, wherein the first spare optical element has a thickness that is different from the thickness of the first optical element; and
adjusting an image quality of the projection objective to correct for imaging effects caused by the thickness difference between the first optical element and the first spare optical element,
wherein the adjusting comprises providing a surface of the first spare optical element with at least one of an aspherical shape and a non-rotationally symmetric shape.

37. The method of claim 36, wherein the adjusting comprises adjusting at least one of a position and a shape of at least one of the plurality of optical elements.

38. The method of claim 36, wherein the adjusting comprises:
    selecting a second optical element disposed in the projection objective at a second location from among the plurality of optical elements, removing the second optical element from the projection objective, and inserting a second spare optical element into the projection objective at the second location,
    wherein the second spare optical element is worked prior to insertion into the projection objective, the working comprising at least one of altering a material thickness of the second spare optical element and providing a surface of the second spare optical element with at least one of an aspherical shape and a non-rotationally symmetric shape.

39. The method of claim 36, wherein removing the first optical element from the projection objective comprises removing the first optical element at a location of use of the lithography projection exposure apparatus.

40. The method of claim 36, further comprising working the first optical element after removal from the projection objective to provide the first spare optical element.

41. The method of claim 38, further comprising:
    measuring the image quality of the projection objective; and
    working the second spare optical element based on a difference between the measured image quality and a desired image quality of the projection objective.

42. The method of claim 38, further comprising, after removing the second optical element, working the second optical element to provide the second spare optical element.

43. The method of claim 38, further comprising, after inserting the first spare optical element and prior to working the second spare optical element:
    measuring an image quality of the projection objective at the location of use;
    calculating a correction profile for the second spare optical element based on the measured image quality; and
    working the second spare optical element based on the calculated correction profile.

44. The method of claim 38, further comprising:
    simulating an image quality of the projection objective, the simulated image quality including an effect of the first spare optical element on the image quality; and
    working the second spare optical element based on a difference between the simulated image quality and a desired image quality of the projection objective.

45. The method of claim 39, wherein adjusting the image quality of the projection objective comprises adjusting the projection objective so that the image quality corresponds approximately to an initial image quality of the projection objective when the projection objective was first installed at the location of use.

46. The method of claim 45, further comprising adjusting the image quality of the projection objective based on at least one of an illumination setting of the projection exposure apparatus and a type of object to be imaged by the projection objective.

* * * * *

UNITED STATES PATENT AND TRADEMARK OFFICE
CERTIFICATE OF CORRECTION

PATENT NO. : 8,605,253 B2  Page 1 of 1
APPLICATION NO. : 12/334685
DATED : December 10, 2013
INVENTOR(S) : Olaf Rogalsky et al.

It is certified that error appears in the above-identified patent and that said Letters Patent is hereby corrected as shown below:

In the Specifications

Col. 6, line 17 (approx.), delete "catadiotric" and insert -- catadioptric --.

In the Claims

Col. 12, line 19, delete "adjust adjusting" and insert -- adjusting --.

Signed and Sealed this
Twenty-fifth Day of March, 2014

Michelle K. Lee
*Deputy Director of the United States Patent and Trademark Office*